(12) United States Patent
Lee et al.

(10) Patent No.: US 10,784,401 B2
(45) Date of Patent: Sep. 22, 2020

(54) LIGHT EMITTING COMPOSITE AND LIGHT EMITTING STRUCTURE AND OPTICAL SHEET AND ELECTRONIC DEVICE

(71) Applicant: Samsung Electronics Co., Ltd., Suwon-si, Gyeonggi-do (KR)

(72) Inventors: Eun Kyung Lee, Seoul (KR); Jiyoung Jung, Seoul (KR); Jeong Il Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 17 days.

(21) Appl. No.: 16/108,296

(22) Filed: Aug. 22, 2018

(65) Prior Publication Data

US 2019/0319166 A1    Oct. 17, 2019

(30) Foreign Application Priority Data

Apr. 12, 2018   (KR) .................. 10-2018-0042876

(51) Int. Cl.
| | |
|---|---|
| *H01L 33/06* | (2010.01) |
| *H01L 33/36* | (2010.01) |
| *H01L 33/50* | (2010.01) |
| *H01L 33/58* | (2010.01) |

(52) U.S. Cl.
CPC .............. *H01L 33/06* (2013.01); *H01L 33/36* (2013.01); *H01L 33/502* (2013.01); *H01L 33/58* (2013.01)

(58) Field of Classification Search
CPC ............ H01L 29/7787; H01L 29/1066; H01L 29/2003; H01L 29/205; H01L 29/42316; H01L 29/66462; H01L 29/7786; H01L 21/0217; H01L 21/0254; H01L 21/30612
See application file for complete search history.

(56) References Cited

U.S. PATENT DOCUMENTS

| | | | |
|---|---|---|---|
| 6,908,978 B2 | 6/2005 | Salamone et al. | |
| 9,193,900 B2 | 11/2015 | Kang et al. | |
| 9,202,997 B2 | 12/2015 | Jang et al. | |
| 2008/0231170 A1 | 9/2008 | Masato et al. | |
| 2008/0238829 A1* | 10/2008 | Kane ................... | H01L 27/3213 345/76 |
| 2016/0017099 A1 | 1/2016 | Furuta | |

(Continued)

FOREIGN PATENT DOCUMENTS

| | | |
|---|---|---|
| EP | 3135739 A1 | 3/2017 |
| KR | 10-1650918 B1 | 8/2016 |

(Continued)

OTHER PUBLICATIONS

Extended European Search Report dated Jul. 16, 2019, issued in corresponding European Patent Application No. 16209268.4.

*Primary Examiner* — Dale E Page
*Assistant Examiner* — Quovaunda Jefferson
(74) *Attorney, Agent, or Firm* — Harness, Dickey & Pierce, P.L.C.

(57) ABSTRACT

A light emitting composite includes a light emitting element and a three dimensional protection structure bound to the light emitting element and surrounding the light emitting element. The three dimensional protection structure includes a $SiO_{3/2}$ moiety and a polymerizable functional group. A light emitting structure, an optical sheet, and an electronic device are also disclosed.

20 Claims, 6 Drawing Sheets

(56) References Cited

U.S. PATENT DOCUMENTS

2016/0155968 A1 6/2016 Lee et al.
2017/0222097 A1 8/2017 Lub et al.

FOREIGN PATENT DOCUMENTS

| KR | 2017-0033411 A | 3/2017 |
| KR | 10-1739576 B1 | 5/2017 |
| WO | WO-2018051269 A1 | 3/2018 |

* cited by examiner

LIGHT EMITTING COMPOSITE AND LIGHT EMITTING STRUCTURE AND OPTICAL SHEET AND ELECTRONIC DEVICE

CROSS-REFERENCE TO RELATED APPLICATION

This application claims priority to and the benefit of Korean Patent Application No. 10-2018-0042876, filed in the Korean Intellectual Property Office on Apr. 12, 2018, the entire contents of which are incorporated herein by reference.

BACKGROUND

1. Field

A light emitting composite, a light emitting structure, an optical sheet, and an electronic device are disclosed.

2. Description of the Related Art

Physical characteristics (e.g., energy bandgaps, melting points, etc.) of nanoparticles that are known as intrinsic characteristics may be controlled by changing their particle size, unlike bulk materials. For example, semiconductor nanocrystals, also known as quantum dots, are supplied with photoenergy or electrical energy and may emit light in a wavelength corresponding to sizes of the quantum dots. Accordingly, the quantum dots may be used as a light emitting element emitting light of a particular wavelength spectrum.

However, light emitting elements like the quantum dots may be not only agglomerated with one another in a solvent or a polymer and thus show deteriorated dispersibility but also are weak regarding moisture or oxygen and thus may be easily oxidized in the air. In addition, the light emitting elements like the quantum dots may show low thermal stability.

SUMMARY

An embodiment provides a light emitting composite capable of improving dispersibility, reliability, and thermal stability of a light emitting element.

Another embodiment provides a light emitting structure including a cured product of the light emitting composite.

Yet another embodiment provides an optical sheet including the light emitting structure.

Still another embodiment provides an electronic device including the light emitting structure.

According to an embodiment, a light emitting composite includes a light emitting element and a three dimensional protection structure bound to the light emitting element and surrounding the light emitting element. The three dimensional protection structure includes a $SiO_{3/2}$ moiety and a polymerizable functional group.

In some embodiments, the light emitting element and the three dimensional protection structure may be bound to each other by —C(═O)NR$^a$— (wherein R$^a$ is hydrogen or a substituted or unsubstituted C1 to C10 hydrocarbon group).

In some embodiments, the light emitting element and the three dimensional protection structure may form a core-shell structure.

In some embodiments, the three dimensional protection structure may include one of —C(═O)—, —C(═O)O—, —OC(═O)—, —N(R$^b$)—C(═O)—, —N(R$^b$)—C(═O)O—, or —N(R$^b$)OC(═O)— (wherein R$^b$ is hydrogen or a substituted or unsubstituted C1 to C10 hydrocarbon group), or a combination thereof.

In some embodiments, the polymerizable functional group may include one of a (meth)acrylate group, an epoxy group, a styrene group, an acrylonitrile group, an N-vinylpyrrolidone group, a vinyl group, a derivative thereof, or a combination thereof.

In some embodiments, the light emitting composite may be a condensation polymerization reaction product of a precursor represented by Chemical Formula 1 and a precursor represented by Chemical Formula 2.

[Chemical Formula 1]

In Chemical Formula 1,

Q is a light emitting element,

L$^1$ is —C(═O)NR$^a$—, wherein R$^a$ is hydrogen or a substituted or unsubstituted C1 to C10 hydrocarbon group, L$^2$ is one of a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C1 to C20 silylene group, a substituted or unsubstituted siloxane group, or a combination thereof, R$^1$ to R$^3$ are independently one of a substituted or unsubstituted C1 to C20 alkoxy group, a hydroxy group, a halogen, or a carboxyl group, and n is an integer of 1 or more.

[Chemical Formula 2]

In Chemical Formula 2,

L$^3$ and L$^5$ are independently one of a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C2 to C20 alkenylene group, a substituted or unsubstituted C2 to C20 alkynylene group, —R$^c$—O—R$^d$—, —R$^c$—N—R$^d$—, —R$^c$—(C═O)—R$^d$—, or a combination thereof, wherein R$^c$ and R$^d$ are independently a C1 to C10 hydrocarbon group, L$^4$ is one of —O—, —S—, —(C═O)—, —(C═O)O—, —O(C═O)—, —(C═O)—NR$^e$—, —(C═O)O—NR$^e$—, or —O(C═O)—NR$^e$—, wherein R$^e$ is one of hydrogen or a substituted or unsubstituted C1 to C6 hydrocarbon group, $R^4$ to $R^6$ are independently one of hydrogen, a substituted or unsubstituted C1 to C20 alkyl group, a substituted or unsubstituted C1 to C20 alkoxy group, a substituted or unsubstituted C3 to C20 cycloalkyl group, a substituted or unsubstituted C6 to C20 aryl group, a substituted or unsubstituted C3 to C20 heterocyclic group, a hydroxy group, a halogen, a carboxyl group, or a combination thereof, provided that at least one of $R^4$ to $R^6$ one of is a substituted or unsubstituted C1 to C20 alkoxy group, a hydroxy group, a halogen, or a carboxyl group, and $R^7$ is hydrogen or a methyl group.

The three dimensional protection structure may be represented by Chemical Formula 3.

[Chemical Formula 3]

In Chemical Formula 3, $R^8$ to $R^{13}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C2 to C30 epoxy group, a substituted or unsubstituted C1 to C30 carbonyl group, a substituted or unsubstituted C1 to C30 carboxyl group, a substituted or unsubstituted amide group, a hydroxyl group, a (meth)acrylate group, a nitrile group, or a combination thereof, one of $R^{13}$'s includes a linking point with the light emitting element bound by —C(=O)NR$^a$— (wherein R$^a$ is hydrogen or a substituted or unsubstituted C1 to C10 hydrocarbon group), at least one of $R^8$ to $R^{13}$ includes a polymerizable functional group, 0≤M1<1, 0≤D1<1, 0<T1<1, 0≤Q1<1, and M1+D1+T1+Q1=1.

In some embodiments, the light emitting element may include one of a quantum dot, phosphor or a combination thereof.

In some embodiments, a particle diameter of the light emitting composite may be at least two times larger than that of the light emitting element.

According to another embodiment, a light emitting structure includes a cured product of the light emitting composite.

In some embodiments, the light emitting structure may further include a cured product of an organometal compound or a cured product of the light emitting composite and an organometal compound.

In some embodiments, the organometal compound may include one of an aluminum compound, a titanium compound, a zirconium compound, a hafnium compound, a magnesium compound, a tin compound, or a combination thereof.

In some embodiments, the light emitting structure may have a weight loss of less than or equal to about 5% at about 300° C.

According to another embodiment, an optical sheet includes the light emitting structure.

According to another embodiment, an electronic device includes the light emitting structure.

In some embodiments, the electronic device may include a light source and a display panel on the light source.

In some embodiments, the light emitting structure may be included in the light source.

In some embodiments, the display panel may include a color conversion layer that is supplied with first visible light from the light source and emits second visible light in the same wavelength as the first visible light or in a longer wavelength than the first visible light, and the light emitting structure may be included in the color conversion layer.

In some embodiments, the first visible light may be blue light and the second visible light may be blue light, green light, red light, or a combination thereof.

In some embodiments, the electronic device may further include an optical sheet between the light source and the display panel and the light emitting structure may be included in the optical sheet.

In some embodiments, the electronic device may include a first electrode and a second electrode facing each other and an emission layer between the first electrode and the second electrode. The emission layer may include the light emitting structure.

The light emitting composite has improved dispersibility, reliability and thermal stability and may be effectively applied to a device.

DETAILED DESCRIPTION

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, 'combination' refers to a mixture of two or more and a stack structure of two or more.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, C3 to C15 cycloalkenyl group, a C6 to C15 cycloalkynyl group, a C3 to C30 heterocycloalkyl group, or a combination thereof.

As used herein, when a definition is not otherwise provided, "hetero" refers to inclusion of one to three heteroatoms selected from N, O, S, P, and Si.

Hereinafter, a light emitting composite according to an embodiment is described.

Figure 1:
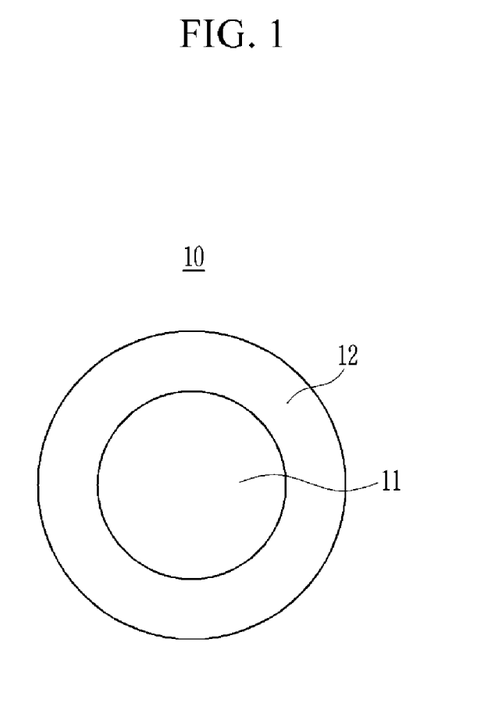
FIG. 1 is a schematic view of a light emitting composite according to an embodiment.

FIG. 1 is a schematic view of a light emitting composite according to an embodiment.

Referring to FIG. 1, a light emitting composite 10 according to an embodiment includes a light emitting element 11 and a protection structure 12 surrounding the light emitting element 11.

The light emitting element 11 may be a material stimulated by light or electricity and itself emitting light in an intrinsic wavelength range and thus include any particle emitting light at a desired (and/or alternatively predetermined) wavelength without a particular limit. The light emitting element 11 may be for example a quantum dot, a phosphor, or a combination thereof.

For example, the light emitting element 11 may emit light in at least one part wavelength region of a visible ray region, for example blue light, red light, green light, or combined light thereof. Herein, the blue light may have for example a peak emission wavelength ($\lambda_{peak}$) in a wavelength region of about 430 nm to about 470 nm, the red light may have for example a peak emission wavelength ($\lambda_{peak}$) in a wavelength region of about 620 nm to about 660 nm, and the green light may have for example a peak emission wavelength ($\lambda_{peak}$) in a wavelength region of about 510 nm to about 550 nm.

For example, the light emitting element 11 may have for example a particle diameter (an average largest particle diameter for a non-spherical shape) of about 1 nm to about 80 nm, about 1 nm to about 50 nm, about 1 nm to about 40 nm, about 1 nm to about 30 nm, or about 1 nm to about 20 nm.

For example, the light emitting element 11 may be a quantum dot. The quantum dot may be a semiconductor nanocrystal in a general concept, and may have various shapes, for example an isotropic semiconductor nanocrystal, a quantum rod, and a quantum plate.

The quantum dot may be for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be for example selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, but is not limited thereto. The Group III-V semiconductor compound may be for example selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but is not limited thereto. The Group IV-VI semiconductor compound may be for example selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof, but is not limited thereto. The Group IV semiconductor compound may be for example selected from a singular element semiconductor compound selected from Si, Ge, and a mixture thereof; and a binary element semiconductor compound selected from SiC, SiGe, and a mixture thereof, but is not limited thereto. The Group I-III-VI semiconductor compound may be for example selected from CuInSe$_2$, CuInS$_2$, CuInGaSe, CuInGaS, and a mixture thereof, but is not limited thereto. The Group I-II-IV-VI semiconductor compound may be for example selected from CuZnSnSe and CuZnSnS, but is not limited thereto. The Group II-III-V semiconductor compound may include for example InZnP, but is not limited thereto.

The quantum dot may have a core-shell structure including a core and a shell. For example, since a material composition of the shell of the quantum dot may have a higher energy bandgap than a material composition the core of the quantum dot, the quantum dot may have a quantum confinement effect and thus emit light. For example, the shell of the quantum dot may be a monolayer or a multi-layer, and for example shells of the multi-layer, a shell of that is far from the core may have a higher energy bandgap than a shell that is near to the core, and thereby the quantum dot may exhibit a quantum confinement effect. The material forming the core of the quantum dot may be different from the material forming the shell of the quantum dot, and these materials may be respectively selected from the above semiconductor compounds as long as the quantum confinement effect is obtained.

The light emitting element 11 may have a plurality of reaction sites capable of causing a condensation reaction on the surface, and the reaction sites may be for example hydrophilic reaction sites, for example, a carboxyl group and/or an amide group. The reaction sites such as the carboxyl group and/or the amide group may be obtained through a hydrophilic surface treatment of the light emitting element 11.

The light emitting element 11 is surrounded with a protection structure 12 and forms a three-dimensional structure, for example, both the light emitting element 11 and the protection structure 12 may form a core-shell structure. The protection structure 12 may include a plurality of a polymer chains including an organic/inorganic hybrid material, and each polymer chain is bound to the surface of the light emitting element 11. For example, the light emitting element 11 and the protection structure 12 are bound to each other by *—C(=O)NR$^a$—* (wherein R$^a$ is hydrogen or a substituted or unsubstituted C1 to C10 hydrocarbon group), wherein one * may be a binding point on the surface of the light emitting element 11, and another * may be a binding point of a polymer chain of the protection structure 12.

For example, each polymer of the protection structure 12 may be polyorganosiloxane, for example, polyorganosiloxane having a three dimensional structure having a $SiO_{3/2}$ moiety. The polyorganosiloxane having a three dimensional structure may have a polymerizable functional group at the terminal end, and the polymerizable functional group may be for example a (meth)acrylate group, an epoxy group, a styrene group, an acrylonitrile group, an N-vinylpyrrolidone group, a vinyl group, a derivative thereof, or a combination thereof, but is not limited thereto. The polymerizable functional group may form a dense network structure through photocuring and/or thermal curing during the formation of a thin film.

For example, each polymer of the protection structure 12 may include —C(=O)—, —C(=O)O—, —OC(=O)—, —N($R^b$)—C(=O)—, —N($R^b$)—C(=O)O—, —N($R^b$)OC(=O)— (wherein $R^b$ is hydrogen or a substituted or unsubstituted C1 to C10 hydrocarbon group), or a combination thereof in its structure.

For example, each polymer of the protection structure 12 may be represented by Chemical Formula 3.

[Chemical Formula 3]

In Chemical Formula 3, $R^8$ to $R^{13}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C2 to C30 epoxy group, a substituted or unsubstituted C1 to C30 carbonyl group, a substituted or unsubstituted C1 to C30 carboxyl group, a substituted or unsubstituted amide group, a hydroxyl group, a (meth)acrylate group, a nitrile group, or a combination thereof, one of $R^{13}$'s includes a linking point with the light emitting element bound by —C(=O)$NR^a$— (wherein $R^a$ is hydrogen or a substituted or unsubstituted C1 to C10 hydrocarbon group), at least one of $R^8$ to $R^{13}$ includes a polymerizable functional group, $0 \leq M1 < 1$, $0 \leq D1 < 1$, $0 < T1 < 1$, $0 \leq Q1 < 1$, and $M1+D1+T1+Q1=1$.

For example, at least one of $R^8$ to $R^{13}$ of Chemical Formula 3 may include a polymerizable functional group and the polymerizable functional group may include for example a (meth)acrylate group, an epoxy group, a styrene group, an acrylonitrile group, an N-vinylpyrrolidone group, a vinyl group, a derivative thereof, or a combination thereof.

For example, at least one of $R^8$ to $R^{13}$ of Chemical Formula 3 may include —C(=O)—, —C(=O)O—, —OC(=O)—, —N($R^b$)—C(=O)—, —N($R^b$)—C(=O)O—, —N($R^b$)OC(=O)— (wherein $R^b$ is hydrogen or a substituted or unsubstituted C1 to C10 hydrocarbon group), or a combination thereof.

For example, the light emitting composite 10 may be a condensation polymerization reaction product obtained through a reaction of an organic/inorganic hybrid monomer and/or precursors of an oligomer, for example, through a reaction of the hydrophilic light emitting element 11 in a sol state with a siloxane precursor, a reaction product of at least one silicon monomer, and another siloxane precursor having a polymerizable functional group.

The silicon monomer may be for example a substituted or unsubstituted silane monomer, for example at least one monomer represented by $R^aR^bR^cSiZ^1$, at least one monomer represented by $R^dR^eSiZ^2Z^3$, at least one monomer represented by $R^fSiZ^4Z^5Z^6$, and/or at least one monomer represented by $SiZ^7Z^8Z^9Z^{10}$. Herein, $R^a$ to $R^f$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C2 to C30 epoxy group, a substituted or unsubstituted C1 to C30 carbonyl group, a hydroxy group, or a combination thereof, and $Z^1$ to $Z^{10}$ are independently C1 to C6 alkoxy group, a hydroxy group, a halogen, a carboxyl group or a combination thereof. For example, one of $R^a$ to $R^f$ may be a C1 to C20 alkyl group substituted with an amino group or a carboxyl group.

The condensation polymerization reaction product may be condensation-polymerized and bonded with the hydrophilic light emitting element 11 and simultaneously, form polyorganosiloxane having a three dimensional structure through a hydrolysis and a condensation polymerization among the silicon monomers.

For example, the light emitting composite 10 may be a condensation polymerization reaction product of a precursor represented by Chemical Formula 1 and a precursor represented by Chemical Formula 2.

[Chemical Formula 1]

In Chemical Formula 1,

Q is a light emitting element,

$L^1$ is —C(=O)$NR^a$—, wherein $R^a$ is hydrogen or a substituted or unsubstituted C1 to C10 hydrocarbon group, $L^2$ is a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C1 to C20 silylene group, a substituted or unsubstituted siloxane group, or a combination thereof, $R^1$ to $R^3$ are independently a substituted or unsubstituted C1 to C20 alkoxy group, a hydroxy group, a halogen, or a carboxyl group, and n is an integer of 1 or more.

[Chemical Formula 2]

In Chemical Formula 2, $L^3$ and $L^5$ are independently a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C2 to C20 alkenylene group, a substituted or unsubstituted C2 to C20 alkynylene group, —$R^c$—O—$R^d$—, —$R^c$—N—$R^d$—, —$R^c$—(C=)—$R^d$—, or a combination thereof, wherein $R^c$ and $R^d$ are independently a C1 to C10 hydrocarbon group,

$L^4$ is —O—, —S—, —(C=O)—, —(C=O)O—, —O(C=O)—, —(C=O)—$NR^e$—, —(C=O)O—$NR^e$—, or —O(C=O)—$NR^e$—, wherein $R^e$ is hydrogen or a substituted or unsubstituted C1 to C6 hydrocarbon group, $R^4$ to $R^6$ are independently hydrogen, a substituted or unsubstituted C1 to C20 alkyl group, a substituted or unsubstituted C1 to C20 alkoxy group, a substituted or unsubstituted C3 to C20 cycloalkyl group, a substituted or unsubstituted C6 to C20 aryl group, a substituted or unsubstituted C3 to C20 heterocyclic group, a hydroxy group, a halogen, a carboxyl group, or a combination thereof, provided that at least one of $R^4$ to $R^6$ is a substituted or unsubstituted C1 to C20 alkoxy group, a hydroxy group, a halogen, or a carboxyl group, and

$R^7$ is hydrogen or a methyl group.

For example, the precursor represented by Chemical Formula 1 may be represented by Chemical Formula 1a or 1b.

[Chemical Formula 1a]

[Chemical Formula 1b]

In Chemical Formula 1a or 1b,

Q is a light emitting element,

$L^2$ is a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C1 to C20 silyl group, a substituted or unsubstituted siloxane group, or a combination thereof, $R^{1a}$ to $R^{3a}$ are independently hydrogen or a substituted or unsubstituted C1 to C20 alkyl group, n is an integer of 1 or more.

For example, the precursor represented by Chemical Formula 2 may be represented by Chemical Formula 2a.

[Chemical Formula 2a]

In Chemical Formula 2a, $L^3$ and $L^5$ are independently a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C2 to C20 alkenylene group, a substituted or unsubstituted C2 to C20 alkynylene group, —$R^c$—O—$R^d$—, —$R^c$—N—$R^d$—, —$R^c$—(C=O)—$R^d$—, or a combination thereof, wherein $R^c$ and $R^d$ are independently a C1 to C10 hydrocarbon group, and $R^{4a}$ to $R^{6a}$ are independently hydrogen or a substituted or unsubstituted C1 to C20 alkyl group.

A particle diameter of the light emitting composite 10 may have at least about 1.5 times, for example at least about 2 times larger than that of the light emitting element 11.

The light emitting composite 10 may be cured by heat and/or light and thus form a light emitting structure. The light emitting structure may include a cured product of the above light emitting composite 10 and be included in a thin film, a sheet, a film, or a device requiring a light emission.

The light emitting structure may be obtained by coating a composition including the above light emitting composite 10 and curing it.

The composition may include for example the light emitting composite 10, a cross-linking agent, a cross-linking auxiliary agent, and a solvent or a polymer.

The light emitting composite 10 is the same as described above.

The cross-linking agent may be for example a photo-cross-linking agent and/or a thermal cross-linking agent, and herein, the photo-cross-linking agent may be for example a (meth)acrylate compound like pentaerythritoltriacrylate, and the thermal cross-linking agent may be for example an ether compound such as trimethylopropanetriglycidylether, 1,4-butanedioldivinylether, tri(ethylene glycol)divinylether, trimethylolpropanetrivinylether, or 1,4-cyclohexanedimethanoldivinylether or a combination thereof, but is not limited thereto.

The cross-linking agent may be included in an amount of about 0.1 to 50 parts by weight, for example, in an amount of about 10 to 50 parts by weight based on 100 parts by weight of the light emitting composite 10.

The cross-linking auxiliary agent may be, for example, a photo-cross-linking auxiliary agent and/or a thermal cross-linking auxiliary agent, for example, a polymer and/or an organometal compound. The cross-linking auxiliary agent may be for example an organometallic compound such as an aluminum compound, a titanium compound, a zirconium compound, a hafnium compound, a magnesium compound, a tin compound, or a combination thereof, for example, aluminum acetoacetate but is not limited thereto.

The cross-linking agent may be included in an amount of about 0.1 to 30 parts by weight, for example, in an amount of about 1 to 20 parts by weight based on 100 parts by weight of the light emitting composite 10.

The composition may further include a reaction initiator, a photoacid generator, and/or a dispersing agent.

The solvent is not particularly limited as long as it may dissolve or disperse the above components, but may be for example an aliphatic hydrocarbon solvent such as hexane, and the like; an aromatic hydrocarbon solvent such as anisole, mesitylene, xylene, and the like; a ketone based solvent such as methylisobutylketone, 1-methyl-2-pyrrolidinone, acetone, and the like; an ether based solvent such as cyclohexanone, tetrahydrofuran, isopropylether, and the like; an acetate based solvent such as ethylacetate, butylacetate, propylene glycolmethyletheracetate, and the like; an alcohol based solvent such as isopropylalcohol, butanol, and the like; an amide based solvent such as dimethyl acetamide, dimethyl formamide, and the like; a silicon-based solvent, or a combination thereof.

The solvent may be included in a balance amount except for the above components, and a total amount of a solid in the composition except for the solvent and may be included in an amount of about 5 wt % to about 80 wt %, for example, about 5 wt % to about 50 wt %.

The polymer may be a matrix dispersing the light emitting composite 10, for example, a transparent polymer. The polymer may be for example polyvinylpyrrolidone, polystyrene, polyethylene, polypropylene, poly(methyl)acrylate, polymethylmethacrylate, polybutylmethacrylate (PBMA), a copolymer thereof, or a combination thereof, but is not limited thereto.

The composition may be coated on a substrate or a lower layer and cured into a light emitting structure. Herein, the coating may be for example spin coating, slit coating, bar coating, Inkjet printing, and/or the like, and the curing may be for example photocuring and/or thermal curing.

The light emitting element 11 is three dimensionally surrounded with the organic/inorganic hybrid protection structure 12 and thus may be suppressed from agglomeration in the solvent or polymer and accordingly, increase dispersion and simultaneously, be effectively protected from moisture or oxygen.

The light emitting structure may include a cured product of the above light emitting composite 10, and the above light emitting composite 10 may further include a cross-linking agent and/or a cured product of a cross-linking auxiliary agent.

The light emitting structure is obtained by curing the light emitting composite including a light emitting element and an organic/inorganic hybrid protection structure to form a three dimensional network structure and much effectively protect the light emitting element ad thus increase thermal/optical and/or electrical stability of the light emitting structure.

For example, the light emitting structure, a cured product of the light emitting composite 10, may have higher thermal stability than a light emitting element having no protection structure, for example, a weight loss about of less than or equal to about 10% at 300° C., a weight loss of less than or equal to about 7% at about 300° C., a weight loss of less than or equal to about 5% at about 300° C., or a weight loss of less than or equal to about 3% at about 300° C.

The light emitting structure may be applied to various fields.

For example, the light emitting structure may be applied to an optical sheet. The optical sheet may receive light in a desired (and/or alternatively predetermined) wavelength region and emit light in the same region or in other wavelength regions.

For example, the light emitting structure may be applied to a light source. The light source including the light emitting structure may supply light in a desired (and/or alternatively predetermined) light wavelength spectrum.

For example, the light emitting structure may be applied to a color conversion layer. The color conversion layer may receive light in a first visible ray region and emit light in the same region as the first visible ray region or light in a second visible ray region differing therefrom.

The optical sheet, the light source, and/or the color conversion layer may be applied to various electronic devices, for example various display devices. The display device may be for example a liquid crystal display (LCD) or an organic light emitting diode device.

Figure 2:
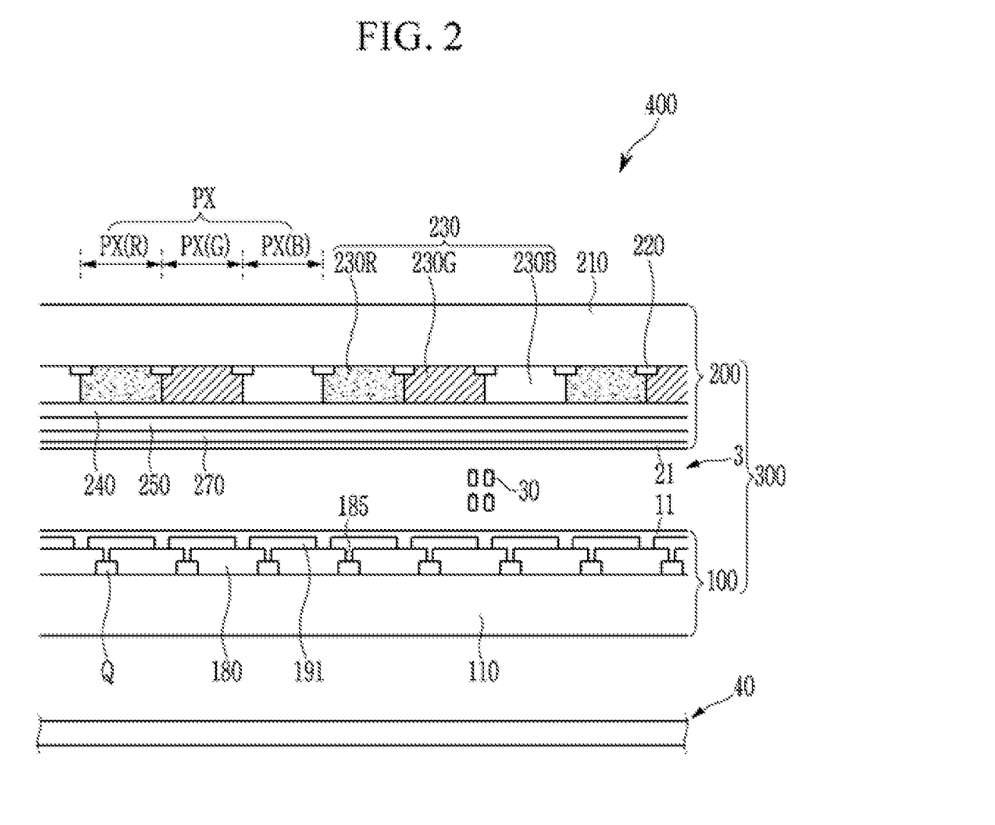
FIG. 2 is a schematic cross-sectional view of a liquid crystal display (LCD) including a color conversion layer according to an embodiment.

FIG. 2 is a schematic cross-sectional view of a liquid crystal display (LCD) according to an embodiment.

Referring to FIG. 2, a liquid crystal display (LCD) 400 according to an embodiment includes a light source 40 and a liquid crystal display panel 300.

The light source 40 may be a planar light source, a dot light source, or a line light source that supplies light with the liquid crystal panel 300, and may be for example disposed in form of an edge-type or a direct type. The light source 40 may include a light emitting region including a light emitting element, a reflector disposed under the light emitting region and reflecting light emitted from the light emitting region, a light guide that supplies the light emitted from the light emitting region toward a liquid crystal panel and/or at least one optical sheet disposed on the light guide, but is not limited thereto.

The light emitting element may be, for example a fluorescent lamp or a light emitting diode (LED), and for example may supply light in a visible ray region (hereinafter, referred to as 'visible light'), for example blue light having high energy.

For example, the light emitting element may include the light emitting structure.

For example, the optical sheet may include the light emitting structure.

The liquid crystal display panel 300 includes a lower display panel 100 disposed on the light source 40, an upper display panel 200 facing the lower display panel 100, and a liquid crystal layer 3 disposed between the lower display panel 100 and the upper display panel 200.

The lower display panel 100 includes a lower substrate 110, a plurality of wires (not shown), a thin film transistor Q, a pixel electrode 191, and an alignment layer 11.

The lower substrate 110 may be, for example, an insulation substrate such as a glass substrate or a polymer substrate, and the polymer substrate may be made of, for example polyethylene terephthalate, polyethylene naphthalate, polycarbonate, polyacrylate, polyimide, or a combination thereof, but is not limited thereto.

A plurality of gate lines (not shown) that supplies a gate signal and a plurality of data line (not shown) that supplies a data signal may be formed while crossing each other on the lower substrate 110, and a plurality of pixels PX are arranged in a form of a matrix defined by the gate lines and the data lines.

A plurality of thin film transistors Q are formed on the lower substrate 110. The thin film transistors Q may include a gate electrode (not shown) connected to the gate lines, a semiconductor (not shown) overlapping with the gate electrode, a gate insulating layer (not shown) disposed between the gate electrode and the semiconductor, a source electrode (not shown) connected to the data lines, and a source electrode and a drain electrode (not shown) facing the same in the center of the semiconductor. In FIG. 2, each pixel PX includes one thin film transistor Q, but is not limited thereto, and two or more thin film transistors may be disposed.

A protective layer 180 is formed on the thin film transistors Q, and the protective layer 180 has a contact hole 185 exposing the thin film transistors Q.

A pixel electrode 191 is formed on the protective layer 180. The pixel electrode 191 may be made of a transparent conductor such as ITO or IZO, and is electrically connected to the thin film transistor Q through the contact hole 185. The pixel electrode 191 may have a desired (and/or alternatively predetermined) pattern.

An alignment layer 11 is formed on the pixel electrode 191.

The upper display panel 200 includes an upper substrate 210, a color conversion layer 230, a common electrode 270, and an alignment layer 21.

The upper substrate 210 may be, for example, an insulation substrate such as a glass substrate or a polymer substrate, and the polymer substrate may be made of, for example polyethylene terephthalate, polyethylene naphthalate, polycarbonate, polyacrylate, polyimide, or a combination thereof, but is not limited thereto.

A light blocking member 220 that is referred to as a black matrix is formed on one surface of the upper substrate 210. The light blocking member 220 may block light leakage between the pixel electrodes 191.

In addition, a color conversion layer 230 is formed on one surface of the upper substrate 210. The color conversion layer 230 is supplied with light in a desired (and/or alternatively predetermined) wavelength region and emits the same light or light in a different wavelength region to display colors. The color conversion layer 230 may include the light emitting structure (e.g., a cured product of the light emitting composite 10 in FIG. 1).

For example, the light emitting structure included in the color conversion layer 230 may emit light in the same wavelength region supplied from the light source 40 or light in a longer wavelength region. For example, when the light source 40 supplies blue light, the light emitting structure included in the color conversion layer 230 may emit blue light in the same wavelength region or emit light in a longer wavelength region than blue light, for example red light or green light.

In this way, high photoconversion efficiency and low power consumption may be realized by including the color conversion layer 230 including the light emitting structure. In addition, the color conversion layer 230 including the light emitting structure may much reduce a light loss according to the absorption and thus increase photoefficiency compared with a conventional color filter including a dye and/or a pigment and thus absorbing a considerable dose of light emitted from the light source 40 and showing low photoefficiency. In addition, color purity may be increased by an inherent luminous color of the light emitting element. Furthermore, the light emitting element emits light scattering in all directions and may improve viewing angle characteristics. In addition, as described above, the light emitting structure has higher thermal stability than a quantum dot or a phosphor and thus may limit and/or prevent degradation of the color conversion layer 230 due to heat during the process and/or the operation.

FIG. 2 shows a red conversion layer 230R including a red light emitting structure emitting red light, a green conversion layer 230G including a green light emitting structure emitting green light, and a blue conversion layer 230B including a blue light emitting structure emitting blue light, but the present disclosure is not limited thereto. For example, the red conversion layer 230R may emit light in a wavelength region ranging from greater than about 590 nm to less than or equal to about 700 nm, the green conversion layer 230G may emit light in a wavelength region ranging from about 510 nm to about 590 nm, and the blue conversion layer 230B may emit light in a wavelength region ranging from greater than or equal to about 380 nm to less than about 510 nm. For example, the light emitting structure may be for example a light emitting structure emitting cyan light, a light emitting structure emitting magenta light, and/or a light emitting structure emitting yellow light, or additionally include these light emitting structures. For example, when the light source 40 supplies blue light, the blue conversion layer 230B passes the light supplied from the light source 40 without a separate light emitting element as it is and thus display blue, and herein, the blue conversion layer 230B may be empty or include a transparent insulator.

The common electrode 270 is formed on one surface of the color conversion layer 230. The common electrode 270 may be, for example made of a transparent conductor such as ITO or IZO and formed on a whole surface of the upper phase difference layer 250. The common electrode 270 has a desired (and/or alternatively predetermined) pattern.

The alignment layer 21 is coated on one surface of the common electrode 270.

The liquid crystal layer 3 including a plurality of liquid crystals 30 is disposed between the lower display panel 100 and the upper display panel 200. The liquid crystal 30 may have positive or negative dielectric anisotropy. For example, the liquid crystal 30 may have negative dielectric anisotropy. For example, the liquid crystal 30 may be aligned in a substantially vertical direction to the surfaces of the substrates 110 and 210 when an electric field is not applied to the pixel electrode 191 and the common electrode 270. Thereby the liquid crystal display 500 may realize a vertical alignment liquid crystal display.

For example, the light emitting structure may be applied to a light emitting device.

Figure 3:
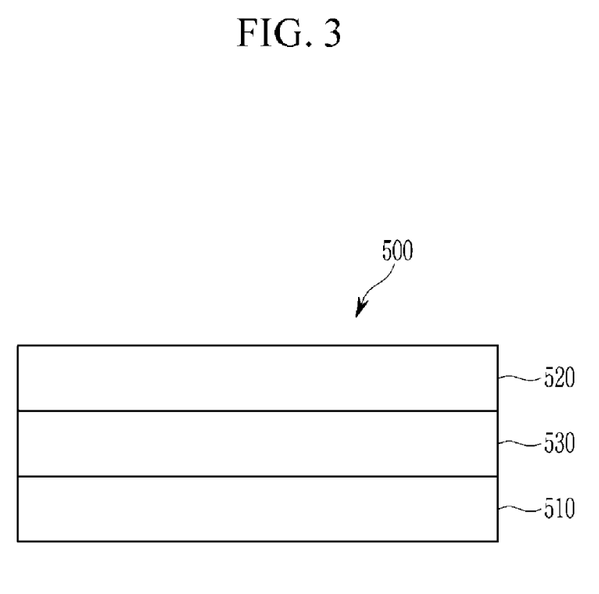
FIG. 3 is a cross-sectional view of a light emitting device according to an embodiment.

FIG. 3 is a cross-sectional view of a light emitting device according to an embodiment.

Referring to FIG. 3, a light emitting device 500 according to an embodiment includes an anode 510 and a cathode 520 facing each other and an emission layer 530 disposed between the anode 510 and the cathode 520.

A substrate (not shown) may be disposed on a surface of the anode 510 or on a surface of the cathode 520. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer.

The anode 510 may be made of a conductor having a relatively large work function to help hole injection, and may be for example a metal, a conductive metal oxide, or a combination thereof. The anode 510 may be for example made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The cathode 520 may be for example made of a conductor having relatively low work function conductor to help electron injection and may be for example made of a metal, a conductive metal oxide, and/or a conductive polymer. The cathode 520 may be for example a metal or an alloy thereof such as magnesium, calcium, sodium, potassium, titanium, indium, yttrium, lithium, gadolinium, aluminum silver, tin, lead, cesium, or barium; a multi-layer structure material such as LiF/Al, LiO$_2$/Al, LiF/Ca, Liq/Al, and BaF$_2$/Ca, but is not limited thereto.

At least one of the anode 510 and the cathode 520 may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the anode 510 and the cathode 520 is a non-light-transmitting electrode, it may be made of for example an opaque conductor such as aluminum (Al), silver (Ag), or gold (Au).

The emission layer 530 may include the light emitting structure.

A charge auxiliary layer (not shown) may be further disposed between the anode 510 and the emission layer 530 and/or between the cathode 520 and the emission layer 530, for example a hole injection layer (HIL), a hole transport layer (HTL) and/or an electron blocking layer between the anode 510 and the emission layer 530 and an electron injection layer (EIL), an electron transport layer (ETL) and/or a hole blocking layer between the cathode 520 and the emission layer 530.

Hereinafter, the embodiments are illustrated in more detail with reference to examples. However, these examples are non-limiting examples, and the present disclosure is not limited thereto.

Synthesis Examples

Synthesis Example 1: Synthesis of Compound 1

[Reaction Scheme 1]

50 mg (0.2 mmol) of a COOH functionalized Cd—Te Quantum dot is added to 10 ml of ethanol, a small amount of p-toluene sulfonic acid as a catalyst is added thereto, and the mixture is refluxed for 24 hours. Subsequently, the reaction solution is cooled down and filtered to obtain 50 mg of Compound 1.

Synthesis Example 2: Synthesis of Compound 2

[Reaction Scheme 2]

Compound 1 (50 mg, 0.2 mmol) is suspended in 10 ml of THF, and 3-aminopropyltrimethoxy silane (36 mg, 0.2 mmol) and ZrCl (5 mg, 0.002 mol) are added thereto. Subsequently, the obtained mixture is refluxed for 24 hours, then, cooled down and refluxed, and filtered to obtain Compound 2.

Synthesis Example 3: Synthesis of Compound 4

[Reaction Scheme 3]

5 g of methylalcohol is put in a reactor equipped with a reflux-cooler and made of a glass material, Compound 2 (0.5 g, 1.1 mmol) and Compound 3 (0.4 g, 1.1 mmol) that is a silane compound are added thereto, and the obtained mixture is stirred at room temperature for 1 hour. Then, 0.08 g of a hydrochloric acid aqueous solution having a concentration of 0.1 N is slowly added thereto in a dropwise fashion and the obtained mixture is additionally stirred at room temperature for 2 hour to induce a hydrolysis reaction. Subsequently, the reactant is heated up to 80° C. and further reacted for condensation and polymerization for 36 hours to obtain a light emitting composite (Compound 4).

The obtained light emitting composite has a weight average molecular weight of 2000, a polydispersity index (PDI) of 1.9, and pH 7 when measured in a GPC method. Subsequently, 10 g of propylene glycol monomethyl ether acetate is added to the light emitting composite to dilute it, and the diluted resultant is distilled under a reduced pressure and a condition of 60 cm Hg and 60° C. to remove a byproduct and obtain a light emitting composite dispersed in propylene glycol monomethyl ether acetate.

Evaluation I

A particle diameter distribution of the light emitting composite according to Synthesis Example is compared with that of a CdTe quantum dot.

The particle diameter distributions of the light emitting composite according to Synthesis Example and the CdTe quantum dot are evaluated by using SAXpace (Anton Paar).

Figure 4:
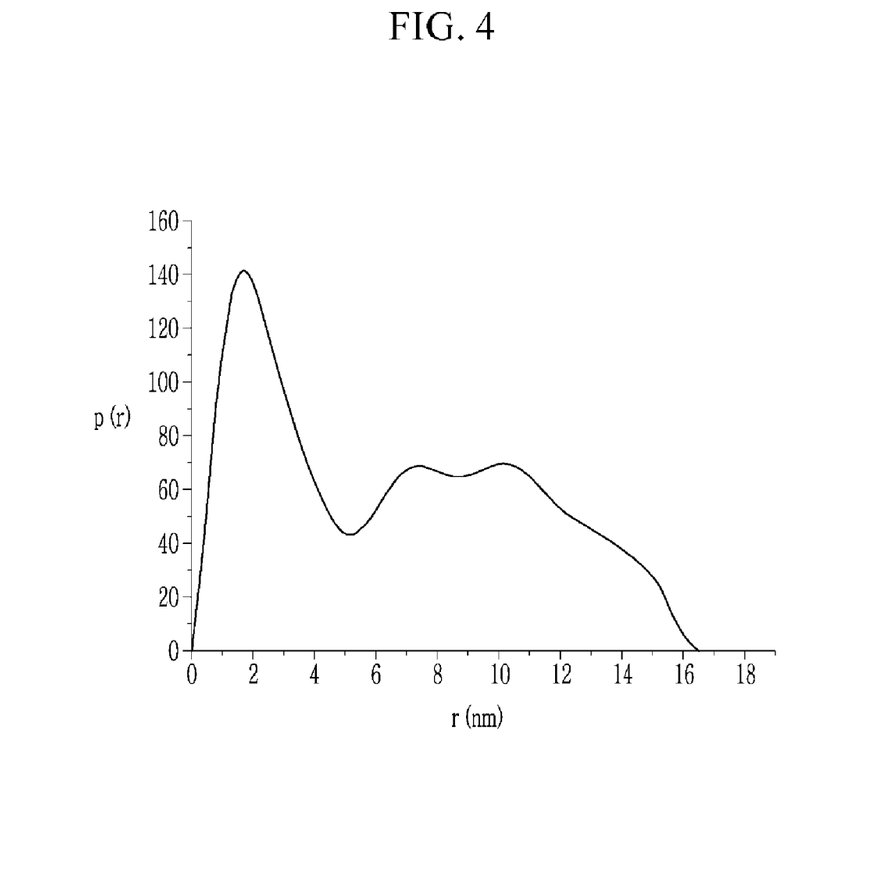
FIG. 4 is a graph showing a particle diameter distribution of the light emitting composite obtained in Synthesis Example.
Figure 5:
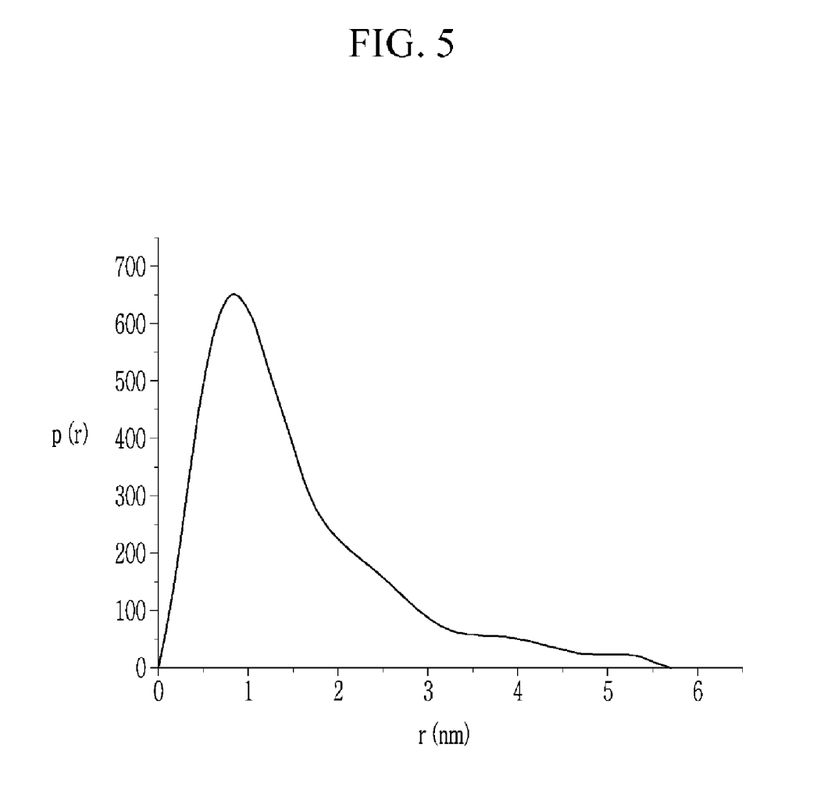
FIG. 5 is a graph showing a particle diameter distribution of the CdTe quantum dot.

FIG. 4 is a graph showing a particle diameter distribution of the light emitting composite obtained in Synthesis Example, and FIG. 5 is a graph showing a particle diameter distribution of the CdTe quantum dot.

Referring to FIGS. 4 and 5, the light emitting composite of Synthesis Example turns out to have a wider particle diameter distribution than the CdTe quantum dot. Specifically, the light emitting composite according to Synthesis Example has a particle diameter distribution of about 0 nm to 16 nm, but the CdTe quantum dot has a particle diameter distribution of about 0 nm to 5.7 nm.

Accordingly, the CdTe quantum dot is surrounded with a protection structure and thus formed into the light emitting composite.

Preparation Examples

Preparation Example 1

A composition is prepared by respectively adding 1 wt % of aluminum acetoacetate and 1 wt % of a photoinitiator (Igacure, BASF) to the light emitting composite according to Synthesis Example based on a total weight of the light emitting composite, propylene glycol monomethyl ether acetate is added thereto to adjust a concentration of the mixture into 35 wt %, and the obtained mixture is mixed with a ball mill for 1 hour to prepare a composition.

Comparative Preparation Example 1

A composition is prepared according to the same method as Preparation Example 1 except for using a CdTe quantum dot instead of the light emitting composite according to Synthesis Example.

Formation of Thin Film

Example 1

The composition according to Preparation Example 1 is spin-coated on a glass substrate, pre-cured (pre-annealed) at 100° C. for 10 minutes, and cured for 8 minute by using 200 W high pressure mercury lamp having a wavelength region of 240 nm to 400 nm to form a thin film. And then post-cured at 220° C. for 1 hr.

Comparative Example 1

A thin film is formed according to the same method as Example 1 except for coating the composition according to Comparative Preparation Example 1 instead of the composition according to Preparation Example 1.

Evaluation II

Thermal stability of the thin films according to Example 1 and Comparative Example 1 are evaluated.

The thermal stability is evaluated by using a thermogravimetric analyzer (TA instrument, Discovery).

Figure 6:
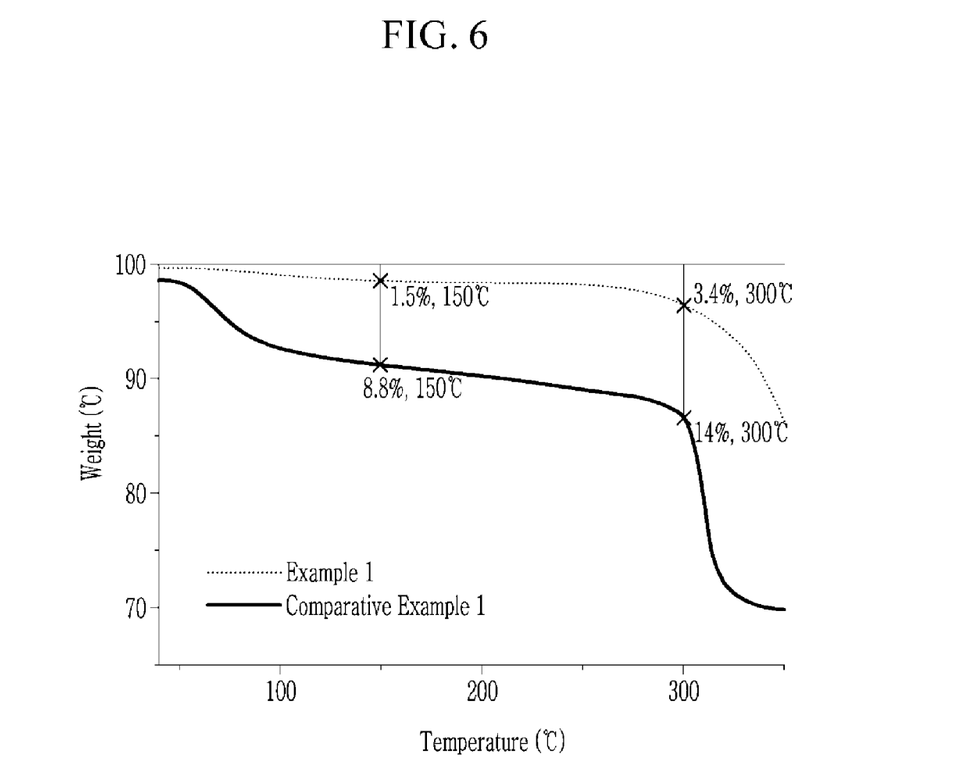
FIG. 6 is a graph showing weight losses depending on a heat treatment of thin films according to Example 1 and Comparative Example 1.

The results are shown in FIG. 6.

FIG. 6 is a graph showing weight losses of the thin films according to Example 1 and Comparative Example 1 depending on a heat treatment.

Referring to FIG. 6, the thin film according to Example 1 has a less weight loss depending on a heat treatment than the thin film according to Comparative Example 1. Specifically, the thin film of Example 1 has a weight loss of about 1.5 wt % at about 150° C., the thin film of Comparative Example 1 has a weight loss of about 8.8 wt %, and the thin film of Example 1 has a weight loss of about 3.4 wt % at about 300° C., but the thin film of Comparative Example 1 has a weight loss of about 14 wt %. Accordingly, the thin film of Example 1 showed higher thermal stability than the thin film of Comparative Example 1.

Evaluation III

Photoluminescence characteristics of the thin film of Example 1 are evaluated.

The photoluminescence characteristics are evaluated by using a fluorescence spectrophotometer (F-7000, Hitachi Ltd.).

The thin film of Example 1 has a peak emission wavelength as shown in Table 1.

TABLE 1

| | Peak emission wavelength ($\lambda_{peak}$) | Full width at half maximum (FWHM) (nm) |
|---|---|---|
| Example 1 | 560 nm | 50 nm |

Referring to Table 1, the thin film of Example 1 has sufficient photoluminescence characteristics.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A light emitting composite, comprising
   a light emitting element, and
   a three dimensional protection structure bound to the light emitting element, and surrounding the light emitting element,
   wherein the three dimensional protection structure comprises a $SiO_{3/2}$ moiety and a polymerizable functional group, and
   the light emitting element and the three dimensional protection structure are bound to each other by —C(=O)NRa— (wherein Ra is hydrogen or a substituted or unsubstituted C1 to C10 hydrocarbon group).

2. The light emitting composite of claim 1, wherein the light emitting element and the three dimensional protection structure form a core-shell structure.

3. The light emitting composite of claim 1, wherein the three dimensional protection structure includes one of —C(=O)—, —C(=O)O—, —OC(=O)—, —N($R^b$)—C(=O)—, —N($R^b$)—C(=O)O—, —N($R^b$)OC(=O)—

(wherein $R^b$ is hydrogen or a substituted or unsubstituted C1 to C10 hydrocarbon group), or a combination thereof.

4. The light emitting composite of claim 1, wherein the polymerizable functional group includes one of a (meth)acrylate group, an epoxy group, a styrene group, an acrylonitrile group, an N-vinylpyrrolidone group, a vinyl group, a derivative thereof, or a combination thereof.

5. The light emitting composite of claim 1, wherein the light emitting composite is a condensation polymerization reaction product of a precursor represented by Chemical Formula 1 and a precursor represented by Chemical Formula 2:

[Chemical Formula 1]

wherein, in Chemical Formula 1,

Q is a light emitting element,

$L^1$ is —C(=O)NR$^a$—, wherein R$^a$ is hydrogen or a substituted or unsubstituted C1 to C10 hydrocarbon group, $L^2$ is one of a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C1 to C20 silylene group, a substituted or unsubstituted siloxane group, or a combination thereof, $R^1$ to $R^3$ are independently one of a substituted or unsubstituted C1 to C20 alkoxy group, a hydroxy group, a halogen, or a carboxyl group, and n is an integer of 1 or more,

[Chemical Formula 2]

wherein, in Chemical Formula 2,

$L^3$ and $L^5$ are independently one of a single bond, a substituted or unsubstituted C1 to C20 alkylene group, a substituted or unsubstituted C6 to C30 arylene group, a substituted or unsubstituted divalent C3 to C30 heterocyclic group, a substituted or unsubstituted C2 to C20 alkenylene group, a substituted or unsubstituted C2 to C20 alkynylene group, —R$^c$—O—R$^d$—, —R$^c$—N—R$^d$—, —R$^c$—(C=O)—R$^d$—, or a combination thereof, wherein R$^c$ and R$^d$ are independently a C1 to C10 hydrocarbon group, $L^4$ is one of —O—, —S—, —(C=O)—, —(C=O)O—, —O(C=O)—, —(C=O)—NR$^e$—, —(C=O)O—NR$^e$—, or —O(C=O)—NR$^e$—, wherein R$^e$ is one of hydrogen or a substituted or unsubstituted C1 to C6 hydrocarbon group, $R^4$ to $R^6$ are independently one of hydrogen, a substituted or unsubstituted C1 to C20 alkyl group, a substituted or unsubstituted C1 to C20 alkoxy group, a substituted or unsubstituted C3 to C20 cycloalkyl group, a substituted or unsubstituted C6 to C20 aryl group, a substituted or unsubstituted C3 to C20 heterocyclic group, a hydroxy group, a halogen, a carboxyl group, or a combination thereof, provided that at least one of $R^4$ to $R^6$ is one of a substituted or unsubstituted C1 to C20 alkoxy group, a hydroxy group, a halogen, or a carboxyl group, and $R^7$ is hydrogen or a methyl group.

6. The light emitting composite of claim 1, wherein the three dimensional protection structure is represented by Chemical Formula 3:

[Chemical Formula 3]

wherein, in Chemical Formula 3, $R^8$ to $R^{13}$ are independently one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C2 to C30 epoxy group, a substituted or unsubstituted C1 to C30 carbonyl group, a substituted or unsubstituted C1 to C30 carboxyl group, a substituted or unsubstituted amide group, a hydroxyl group, a (meth)acrylate group, a nitrile group, or a combination thereof, one of $R^{13}$'s comprises a linking point with the light emitting element bound by —C(=O)NR$^a$— (wherein R$^a$ is hydrogen or a substituted or unsubstituted C1 to C10 hydrocarbon group), at least one of $R^8$ to $R^{13}$ comprises a polymerizable functional group, $0 \leq M1 < 1$, $0 \leq D1 < 1$, $0 < T1 < 1$, $0 \leq Q1 < 1$, and $M1+D1+T1+Q1=1$.

7. The light emitting composite of claim 1, wherein the light emitting element comprises one of a quantum dot, phosphor, or a combination thereof.

8. The light emitting composite of claim 1, wherein a particle diameter of the light emitting composite is at least two times larger than that of the light emitting element.

9. A light emitting structure comprising:
a cured product of the light emitting composite of claim 1.

10. The light emitting structure of claim 9, further comprising:
a cured product of an organometal compound, or
a cured product of the light emitting composite and an organometal compound.

11. The light emitting structure of claim 10, wherein the organometal compound comprises one of an aluminum compound, a titanium compound, a zirconium compound, a hafnium compound, a magnesium compound, a tin compound, or a combination thereof.

12. The light emitting structure of claim 9, wherein the light emitting structure has a weight loss of less than or equal to about 5% at about 300° C.

13. An optical sheet comprising:
the light emitting structure of claim 9.

14. An electronic device comprising:
the light emitting structure of claim 9.

15. The electronic device of claim 14, wherein the electronic device includes a light source, and a display panel on the light source.

16. The electronic device of claim 15, wherein the light emitting structure is included in the light source.

17. The electronic device of claim 15, wherein
the display panel includes a color conversion layer that is supplied with first visible light from the light source and emits second visible light in the same wavelength as the first visible light or in a longer wavelength than the first visible light, and
the light emitting structure is included in the color conversion layer.

18. The electronic device of claim 17, wherein
the first visible light is blue light, and
the second visible light is one of blue light, green light, red light, or a combination thereof.

19. The electronic device of claim 15, further comprising:
an optical sheet between the light source and the display panel, and
wherein the light emitting structure is included in the optical sheet.

20. The electronic device of claim 14, wherein
the electronic device includes a first electrode and a second electrode facing each other, and an emission layer between the first electrode and the second electrode, and
the emission layer includes the light emitting structure.

* * * * *